United States Patent
Rodriguez et al.

(10) Patent No.: US 10,021,797 B1
(45) Date of Patent: Jul. 10, 2018

(54) ELECTRICAL CENTER MOUNTING-BRACKET

(71) Applicant: Delphi Technologies, Inc., Troy, MI (US)

(72) Inventors: Erick A. Rodriguez, Chihuahua (MX); Michael F. Loew, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 15/499,463

(22) Filed: Apr. 27, 2017

(51) Int. Cl.
*H05K 7/14* (2006.01)
*H05K 5/02* (2006.01)

(52) U.S. Cl.
CPC ......... *H05K 5/0204* (2013.01); *H05K 7/1401* (2013.01)

(58) Field of Classification Search
CPC .. H05K 5/0204; H05K 7/1401; H05K 7/1405; H05K 7/1409; H05K 7/1414; H01R 13/62; H01R 13/62938; H01R 13/62955; H01R 13/62966
See application file for complete search history.

(56) References Cited

U.S. PATENT DOCUMENTS 9,640,901 B2 * 5/2017 Hasegawa ............ H01H 50/048
9,826,658 B1 * 11/2017 Mao ..................... H05K 7/1489
2011/0299229 A1 * 12/2011 De La Reza ....... B60R 16/0238
   361/624
2014/0306078 A1 * 10/2014 Shen .................... H05K 5/0204
   248/220.22
2015/0017825 A1 * 1/2015 Kamiya ........... H01R 13/62938
   439/153
2015/0093926 A1 * 4/2015 Henmi ............. H01R 13/62933
   439/157
2016/0219729 A1 * 7/2016 Omari ..................... H02B 1/26
2017/0116806 A1 * 4/2017 Hendricks .......... G07C 9/00944

* cited by examiner

*Primary Examiner* — Hoa C Nguyen
*Assistant Examiner* — Christopher L Augustin
(74) *Attorney, Agent, or Firm* — Robert J. Myers (57) ABSTRACT

A mounting-bracket configured to attach to a mounting-surface includes a base and sides, a retainer, an electrical-assembly, and a blocking-device. The mounting-surface defines a mounting-hole. The base and sides define a cavity. The base includes a retention-device that extends through the mounting-hole. The retention-device has an inner-surface and an outer-surface. The inner-surface defines an aperture and the outer-surface includes locking-tabs. The retainer is received within the aperture of the retention-device. The retainer has an end and walls generally perpendicular to the end. The walls are in direct contact with the inner-surface and prevent an inward-flexure of the locking-tabs. The electrical-assembly has a lower-surface that is received within the cavity. The blocking-device is in direct contact with the lower-surface of the electrical-assembly and the end of the retainer, thereby preventing a removal of the retainer from the aperture when the electrical-assembly is received within the cavity.

10 Claims, 13 Drawing Sheets

ELECTRICAL CENTER MOUNTING-BRACKET

TECHNICAL FIELD OF INVENTION

This disclosure generally relates to a mounting-bracket, and more particularly relates to a mounting-bracket used to mount a bussed electrical center on a vehicle.

BACKGROUND OF INVENTION

It is known to mount bussed electrical centers to a vehicle mounting point for durability against shock and vibration. Typical mounting systems require a mounting-bracket to be fastened to the vehicle using metallic clips and/or nuts and bolts that add additional components, cost, and/or additional processes steps to the perform the mounting operation.

SUMMARY OF THE INVENTION

In accordance with one embodiment, a mounting-bracket configured to attach to a mounting-surface is provided. The mounting-surface has a first-surface and a second-surface opposite the first-surface. The mounting-surface defines a mounting-hole that connects the first-surface to the second-surface. The mounting-bracket includes a base and sides, a retainer, an electrical-assembly, and a blocking-device. The base and sides define a cavity. The base includes a retention-device that extends through the mounting-hole beyond the second-surface. The retention-device has an inner-surface and an outer-surface. The inner-surface defines an aperture. The outer-surface includes locking-tabs that are in direct contact with the second-surface. The retainer is received within the aperture of the retention-device. The retainer has an end and walls generally perpendicular to the end. The walls are in direct contact with the inner-surface and prevent an inward-flexure of the locking-tabs. The electrical-assembly has a lower-surface that is received within the cavity. The blocking-device is in direct contact with the lower-surface of the electrical-assembly and the end of the retainer, thereby preventing a removal of the retainer from the aperture when the electrical-assembly is received within the cavity.

In another embodiment, a mounting-bracket configured to attach to a mounting-surface is provided. The mounting-surface has a first-surface and a second-surface opposite the first-surface. The mounting-surface defines a mounting-hole that connects the first-surface to the second-surface. The mounting-bracket includes a base and sides, a retainer, an electrical-assembly, and a blocking-device. The base and sides define a cavity. The sides include mounting-lugs. The base includes a retention-device that extends through the mounting-hole beyond the second-surface. The retention-device has an inner-surface and an outer-surface. The inner-surface defines an aperture. The outer-surface includes locking-tabs that are in direct contact with the second-surface. The retainer is received within the aperture of the retention-device. The retainer has an end and walls generally perpendicular to the end. When the retainer is in a seated-position the walls are in direct contact with the inner-surface and prevent an inward-flexure of the locking-tabs. The electrical-assembly has a lower-surface that is received within the cavity. The electrical-assembly includes a mate-assist-device movable from an unmated-position to a mated-position. The mate-assist-device is configured to engage and rotate on the mounting-lugs. The lower-surface includes a blocking-device extending below the lower-surface. The retainer is moved to the seated-position by the blocking-device and the blocking-device is in direct contact with the end of the retainer when the mate-assist-device is moved from the unmated-position to the mated-position, thereby preventing a removal of the retainer from the aperture.

In yet another embodiment, a mounting-bracket configured to attach to a mounting-surface is provided. The mounting-surface has a first-surface and a second-surface opposite the first-surface. The mounting-surface defines a mounting-hole that connects the first-surface to the second-surface. The mounting-bracket includes a base and sides and an electrical-assembly. The base and sides define a cavity. The sides include mounting-lugs. The base includes a retention-device that extends through the mounting-hole beyond the second-surface. The retention-device has an inner-surface and an outer-surface. The inner-surface defines an aperture. The outer-surface includes locking-tabs that are in direct contact with the second-surface. The electrical-assembly has a lower-surface that is received within the cavity. The electrical-assembly includes a mate-assist-device movable from an unmated-position to a mated-position. The mate-assist-device is configured to engage and rotate on the mounting-lugs. The lower-surface includes a blocking-device having side-walls generally perpendicular to the lower-surface extending below the lower-surface. The blocking-device is received within the aperture of the retention-device such that the side-walls are in direct contact with the inner-surface. The side-walls prevent an inward-flexure of the locking-tabs when the mate-assist-device is moved from the unmated-position to the mated-position, thereby preventing a removal of the mounting-bracket from the mounting-hole.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

The reference numbers of similar elements in the embodiments shown in the various figures share the last two digits.

DETAILED DESCRIPTION

Figure 1:
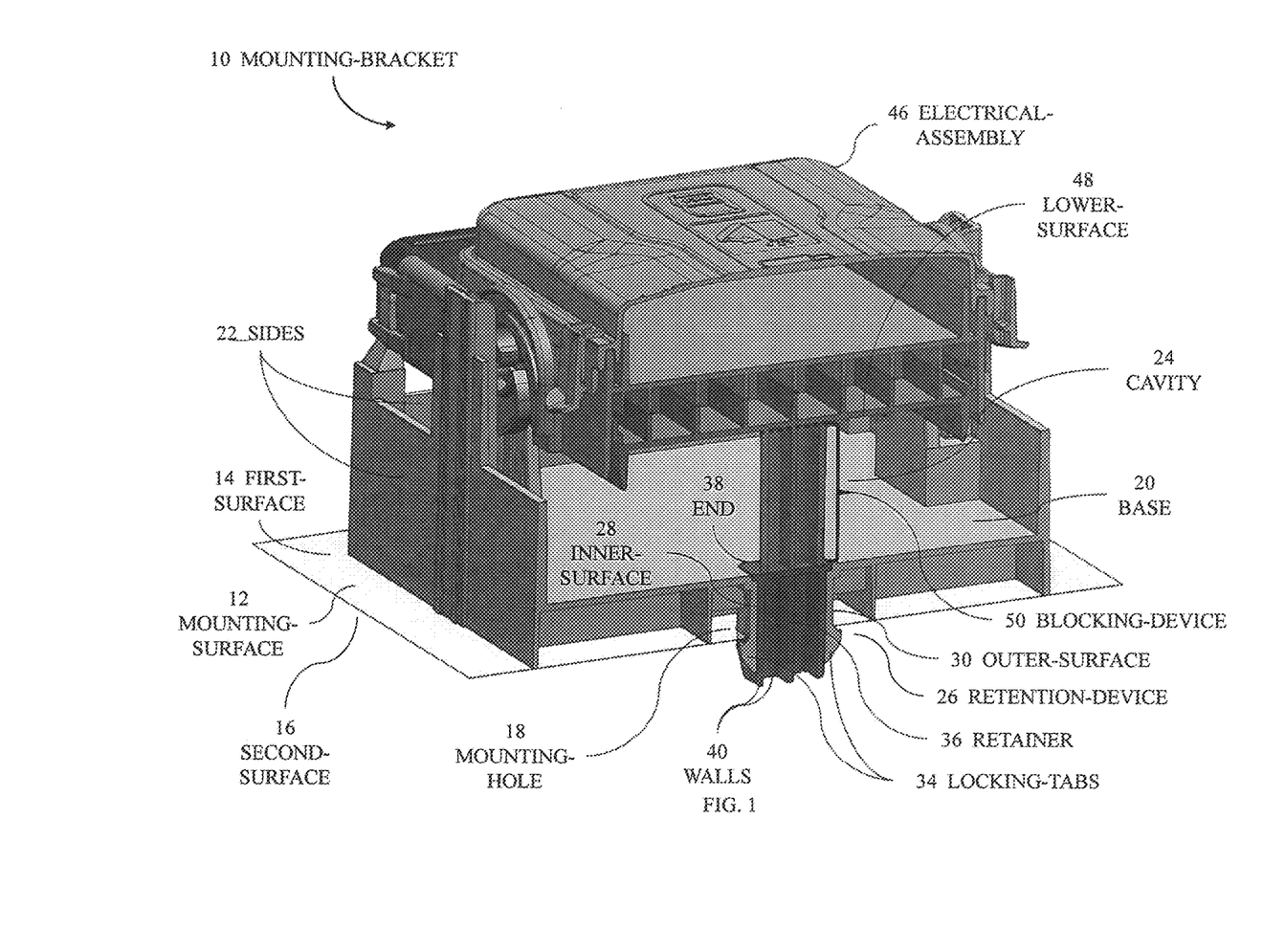
FIG. 1 is a cross-section view of a mounting-bracket in accordance with a first embodiment.

FIG. 1 illustrates a non-limiting example of a mounting-bracket 10 for a bussed electrical center, configured to attach to a mounting-surface 12. The bussed electrical center may be used for automotive applications where environmental factors, such as vibration and temperature variations, require a robust connection to a vehicle. The mounting-surface 12 may be fabricated from a sheet-metal component that is affixed the vehicle, or may be a part of a vehicle frame or body. The mounting-surface 12 has a first-surface 14 and a second-surface 16 opposite the first-surface 14. The mounting-surface 12 defines a mounting-hole 18 that connects the first-surface 14 to the second-surface 16.

Figure 2:
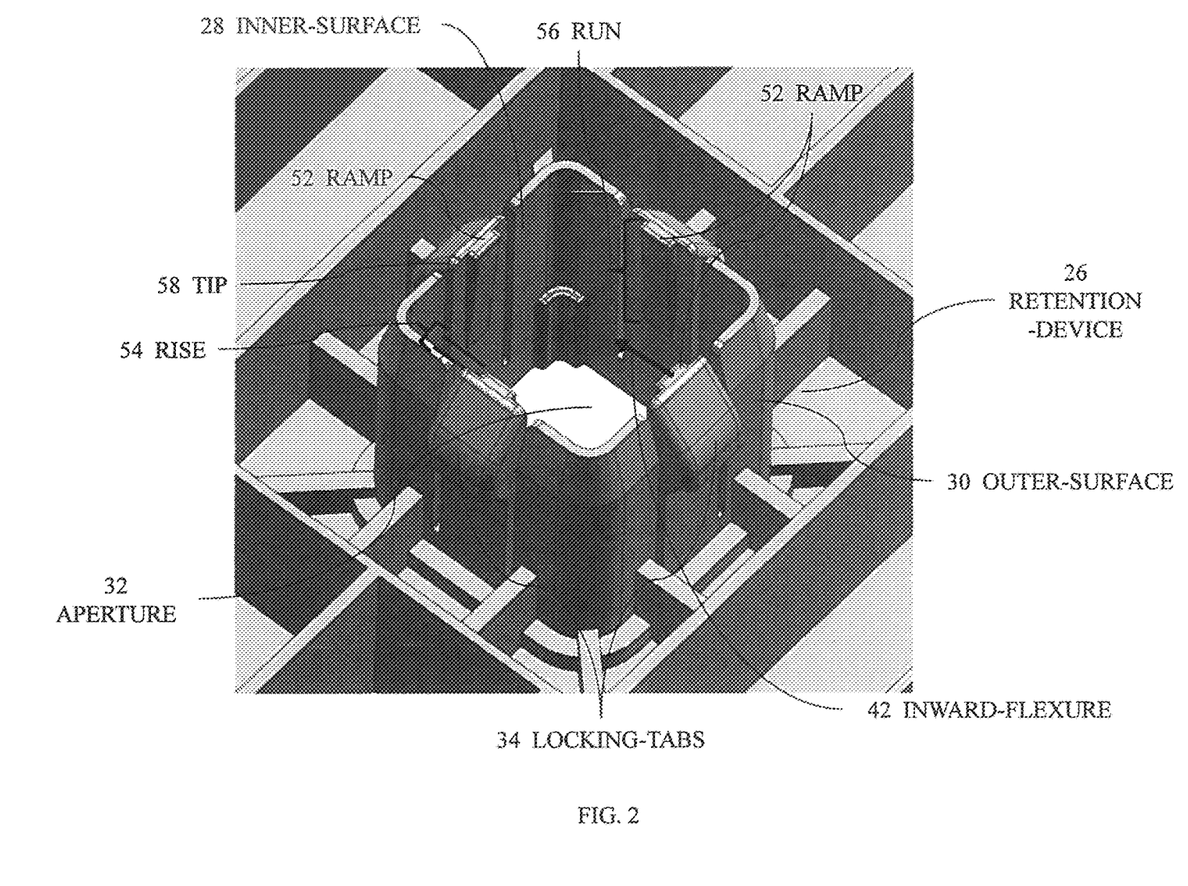
FIG. 2 is an end-view of a retention-device of the mounting-bracket of FIG. 1 in accordance with the first embodiment.

The mounting-bracket 10 includes a base 20 and sides 22 that are formed to define a cavity 24. The base 20 and sides 22 may be fabricated from any material suitable for use in automotive applications, and is preferably made from a non-electrically conductive polymeric material capable of being injection-molded, such as a polyamide (nylon) or a polypropylene material. The cavity 24 may hold electrical-components (not shown) that may include, but are not limited to, connectors, wires, printed-circuit-boards, etc., that may be connected to other electrical-systems (not shown) on the vehicle. The base 20 includes a retention-device 26 that extends through the mounting-hole 18 and beyond the second-surface 16 of the mounting-surface 12. The retention-device 26 has an inner-surface 28 and an outer-surface 30, where the inner-surface 28 defines an aperture 32 (see FIG. 2). The outer-surface 30 includes locking-tabs 34 that may be in direct contact with the second-surface 16 and act to securely hold the mounting-bracket 10 to the mounting-surface 12.

Figure 3:
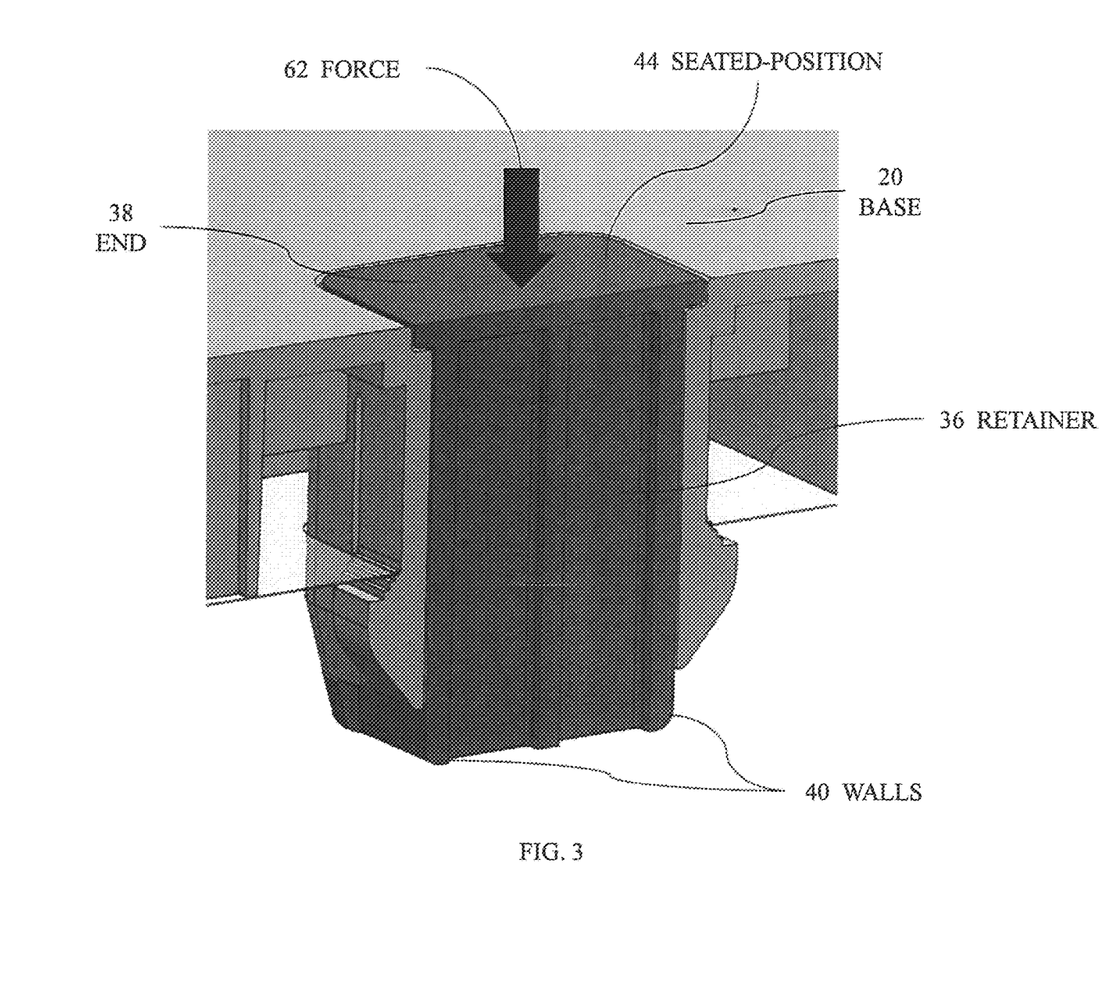
FIG. 3 is a cross-section view of a retainer in accordance with the first embodiment.

The mounting-bracket 10 also includes a retainer 36 (see FIG. 1) that is received within the aperture 32 of the retention-device 26. The retainer 36 is preferably made from a non-electrically conductive polymeric material capable of being injection-molded, such as a nylon or a polypropylene material. The retainer 36 has an end 38 and walls 40 generally perpendicular to the end 38, wherein the walls 40 are in direct contact with the inner-surface 28 and prevent an inward-flexure 42 (see FIG. 2) of the locking-tabs 34. The retainer 36 as illustrated in FIG. 1 and FIG. 3 is shown in a seated-position 44 where the end 38 is flush with the base 20 of the mounting-bracket 10. The end 38 may form a T-shape that is perpendicular to the walls 40 and may rest on a shoulder (not specifically shown) that is recessed into the base 20. The recess may also include a chamfer (not shown) configured to receive a tool (e.g. a flat-blade screw driver) to assist in a removal of the retainer 36 for the purposes of disassembly or service operations. Other configurations are contemplated, but not shown, such as the end 38 resting directly on the base 20 in relief (i.e. not flush with the base 20).

The mounting-bracket 10 also includes an electrical-assembly 46, such as a bussed electrical center, (see FIG. 1) having a lower-surface 48 that is received within the cavity 24. The electrical-assembly 46 may hold electrical-components (not shown) that may include, but are not limited to, electrical-connectors, wires, printed-circuit-boards, etc., that may be connected to other electrical-systems on the vehicle. The electrical-connectors held in the electrical-assembly 46 may mate with the electrical-connectors held in the cavity 24 of the mounting-bracket 10, and may require a significant mating-force depending on the number and types of mating-connectors. The electrical-assembly 46 may also be removably locked to the sides 22 when received within the cavity 24.

The mounting-bracket 10 also includes a blocking-device 50 (see FIG. 1) in direct contact with the lower-surface 48 of the electrical-assembly 46 and the end 38 of the retainer 36, thereby preventing a removal of the retainer 36 from the aperture 32 when the electrical-assembly 46 is received within the cavity 24. The blocking-device 50 may be a separate component that is placed within the cavity 24 prior to the electrical-assembly 46 being received within the cavity 24. The blocking-device 50 is preferably made from a non-electrically conductive polymeric material capable of being injection-molded, such as a nylon or a polypropylene material. The blocking-device 50 may be designed to have sufficient rigidity to assist in the seating of the retainer 36 without causing a deflection of the blocking-device 50.

The blocking-device 50 may also be integrated into the lower-surface 48 of the electrical-assembly 46 such that the blocking-device 50 extends below the lower-surface 48 and is in direct contact with the end 38 of the retainer 36, thereby preventing the removal of the retainer 36 from the aperture 32 when the electrical-assembly 46 is received within the cavity 24.

Figure 4:
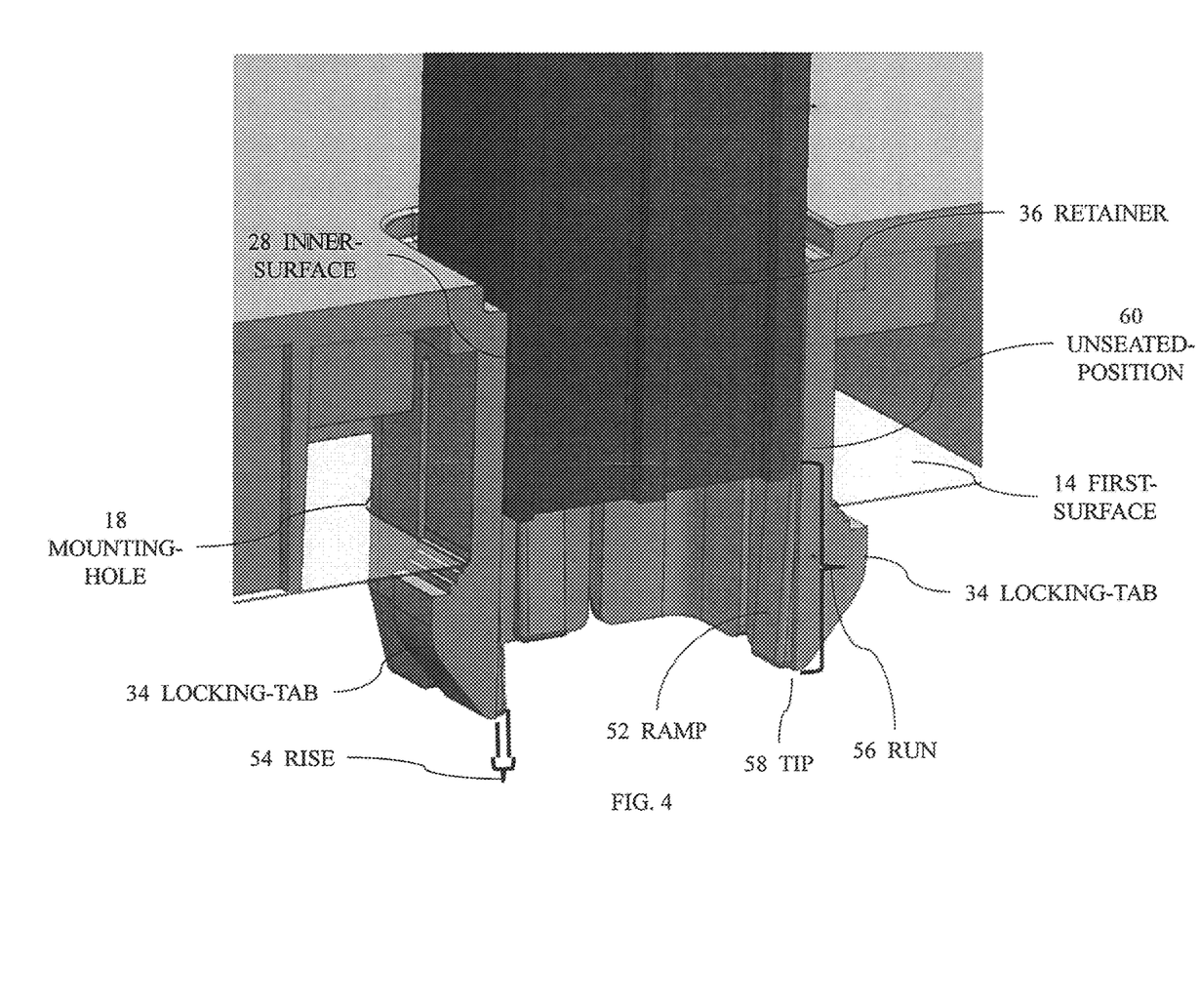
FIG. 4 is a cross-section view of the retainer of FIG. 3 in an unseated-position in accordance with the first embodiment.

The retention-device 26 may include a ramp 52 (see FIG. 2) located on the inner-surface 28. The ramp 52 defines a rise 54 and a run 56, wherein the rise 54 is located opposite a tip 58 of the locking-tabs 34, and the run 56 extends along a portion of the inner-surface 28 opposite the locking-tabs 34 to a point above the first-surface 14 of the mounting-hole 18 (see FIG. 4). The ramp 52 prevents an insertion of the retainer 36 and maintains the retainer 36 in an unseated-position 60 until a force 62 (see FIG. 3) is applied to seat the retainer 36. It will be recognized by those skilled in the art that the retention-device 26 may be inserted in the mounting-hole 18 with minimal effort from an assembler while the retainer 36 is in the unseated-position 60. The force 62 required to seat the retainer 36 is preferably sufficiently large to prevent movement of the retention-device 26 within the mounting-hole 18 when subjected to a vibration-profile (not shown) representative of the vehicle application in the field. Those skilled in the art will recognize that the rise 54, a dimension of the mounting-hole 18, the material properties of the retention-device 26, and the mass of the mounting-bracket 10 will dictate the required force 62 to prevent movement. The required force 62 may be determined using known engineering calculations.

Figure 5:
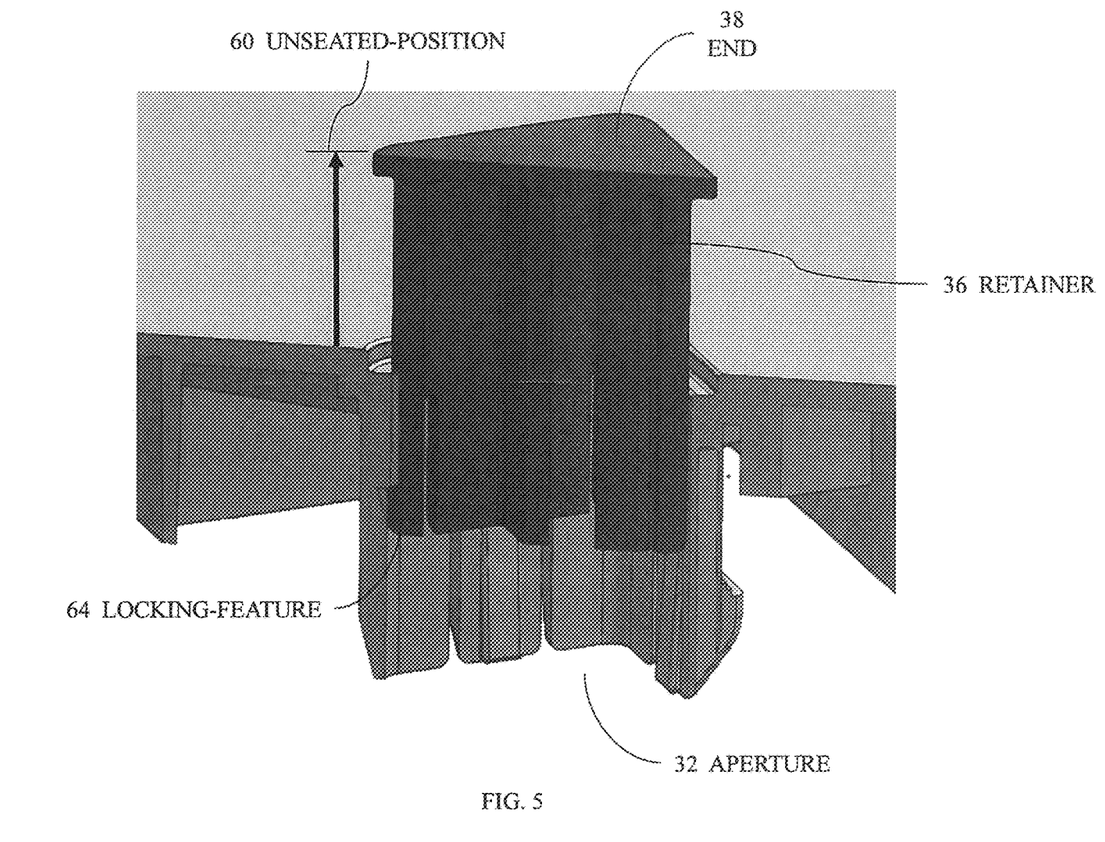
FIG. 5 is a cross-section view of the retainer of FIG. 3 with a locking-feature in accordance with the first embodiment.

The retainer 36 may also include a locking-feature 64 (see FIG. 5) that prevents the retainer 36 from being removed from the aperture 32 when the retainer 36 is in the unseated-position 60. The locking-feature 64 is beneficial during handling of the mounting-bracket 10, such as when being installed by the assembler and may prevent a loss of the retainer 36.

Figure 6:
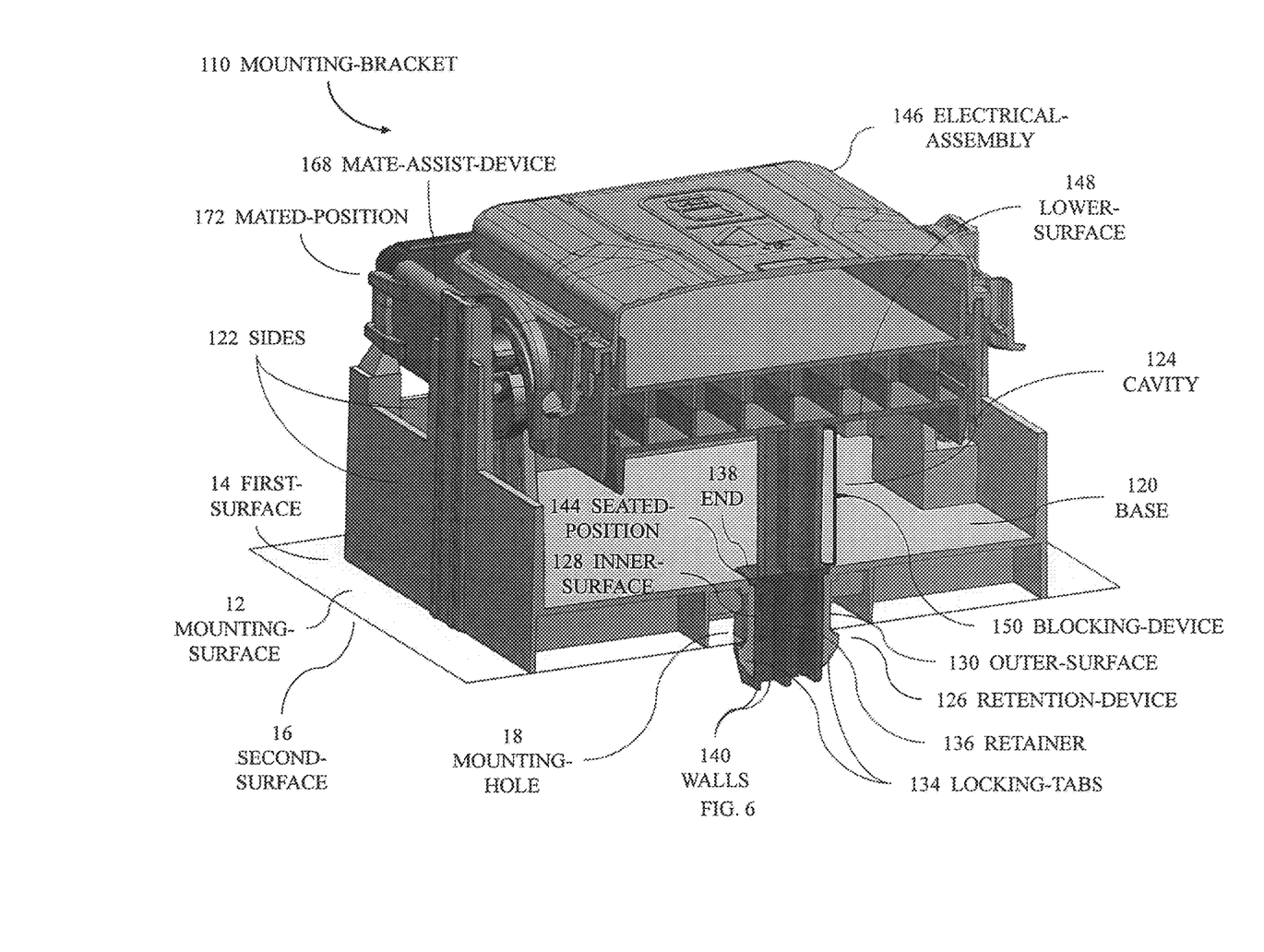
FIG. 6 is a cross-section view of a mounting-bracket in accordance with a second embodiment.
Figure 7:
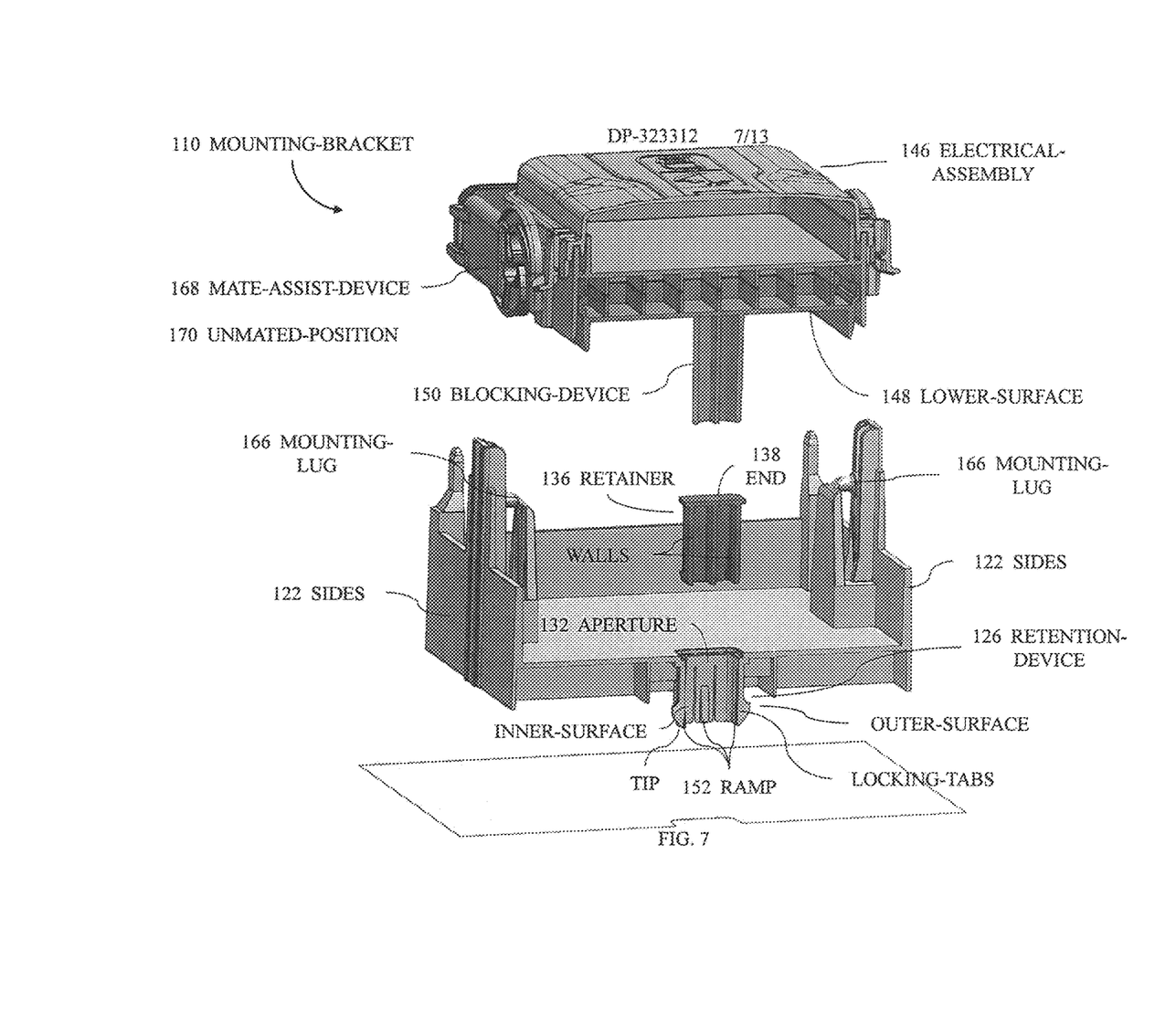
FIG. 7 is a cross-section exploded view of the mounting-bracket of FIG. 6 in accordance with the second embodiment.

A non-limiting example of a second embodiment is illustrated in FIG. 6 in which a mounting-bracket 110 includes sides 122 that include mounting-lugs 166 (see FIG. 7) and an electrical-assembly 146 that includes a mate-assist-device 168 movable from an unmated-position 170 to a mated-position 172. The mate-assist-device 168 is configured to engage and rotate on the mounting-lugs 166. A lower-surface 148 of the electrical-assembly 146 includes a blocking-device 150 extending below the lower-surface 148, wherein a retainer 136 is moved to a seated-position 144 by the blocking-device 150 and the blocking-device 150 is in direct contact with an end 138 of the retainer 136 when the mate-assist-device 168 is moved from the unmated-position 170 to the mated-position 172, thereby preventing a removal of the retainer 136 from an aperture 132.

Figure 8:
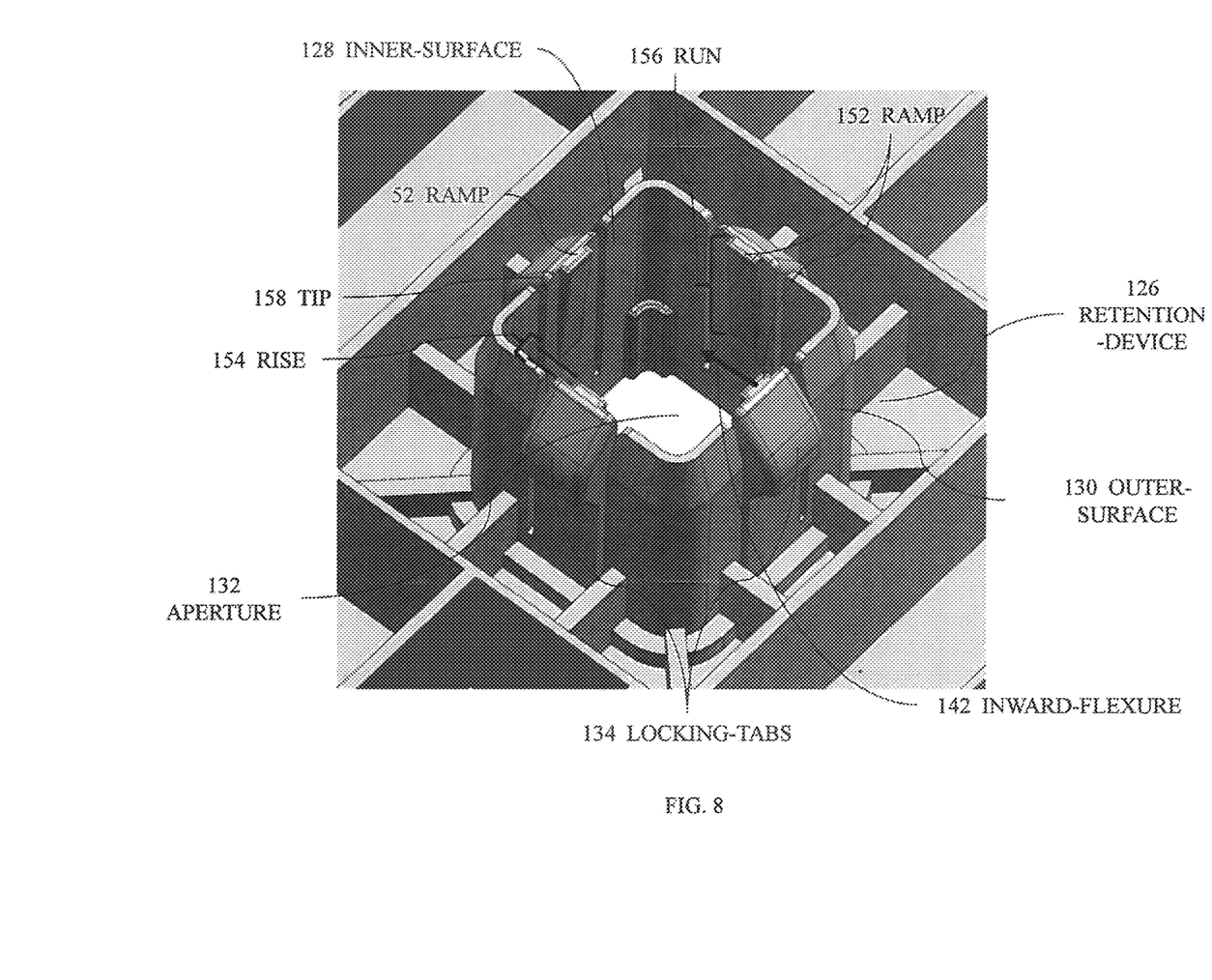
FIG. 8 is an end-view of a retention-device of the mounting-bracket of FIG. 7 in accordance with the second embodiment.
Figure 9:
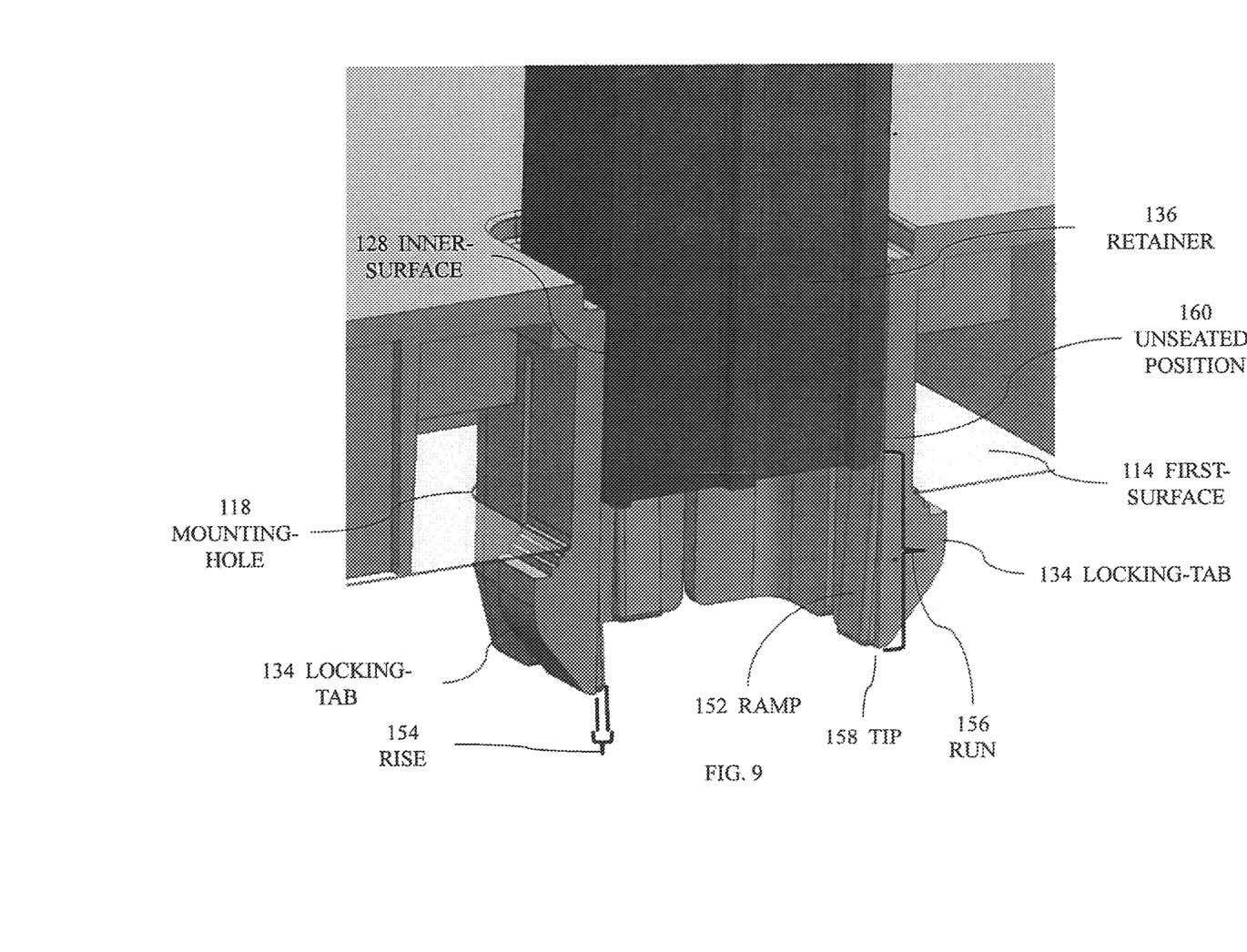
FIG. 9 is a cross-section view of the retainer of FIG. 6 in an unseated-position in accordance with the second embodiment.
Figure 10:
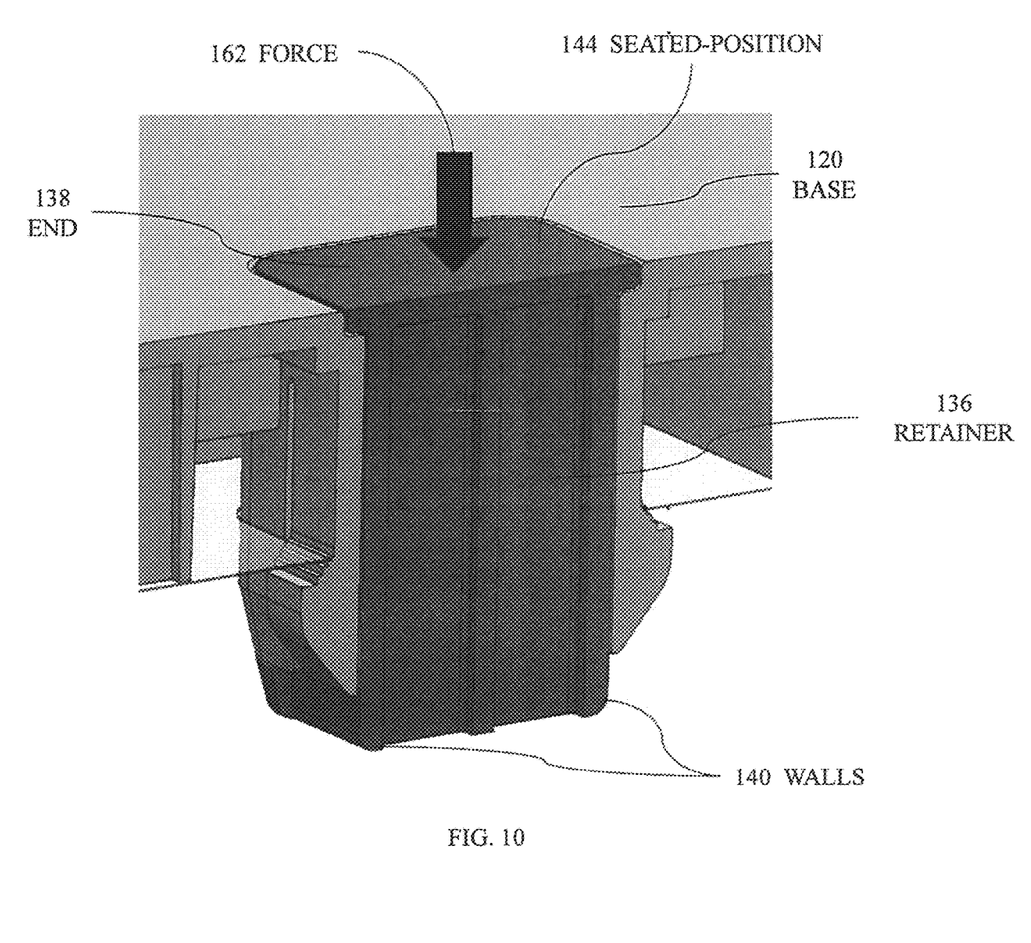
FIG. 10 is a cross-section view of the retainer of FIG. 6 in a seated-position in accordance with the second embodiment.

The mounting-bracket 110 may also include a retention-device 126 that may include a ramp 152 (see FIG. 8) located on an inner-surface 128. The ramp 152 defines a rise 154 and a run 156, wherein the rise 154 is located opposite a tip 158 of a locking-tab 134, and the run 156 extends along a portion of the inner-surface 128 opposite the locking-tabs 134 to a point above a first-surface 114 of a mounting-hole 118 (see FIG. 9). The ramp 152 prevents an insertion of the retainer 136 and maintains the retainer 136 in an unseated-position 160 until a force 162 (see FIG. 10) is applied to seat the retainer 136. It will be recognized by those skilled in the art that the retention-device 126 may be inserted in the mounting-hole 118 with minimal effort from an assembler while the retainer 136 is in the unseated-position 160. The force 162 required to seat the retainer 136 is preferably sufficiently large to prevent movement of the retention-device 126 within the mounting-hole 118 when subjected to a vibration-profile (not shown) representative of the vehicle application in the field. Those skilled in the art will recognize that the rise 154, a dimension of the mounting-hole 118, the material properties of the retention-device 126, and the mass of the mounting-bracket 110 will dictate the required force 162 to prevent movement which may be determined using known engineering calculations.

Figure 11:
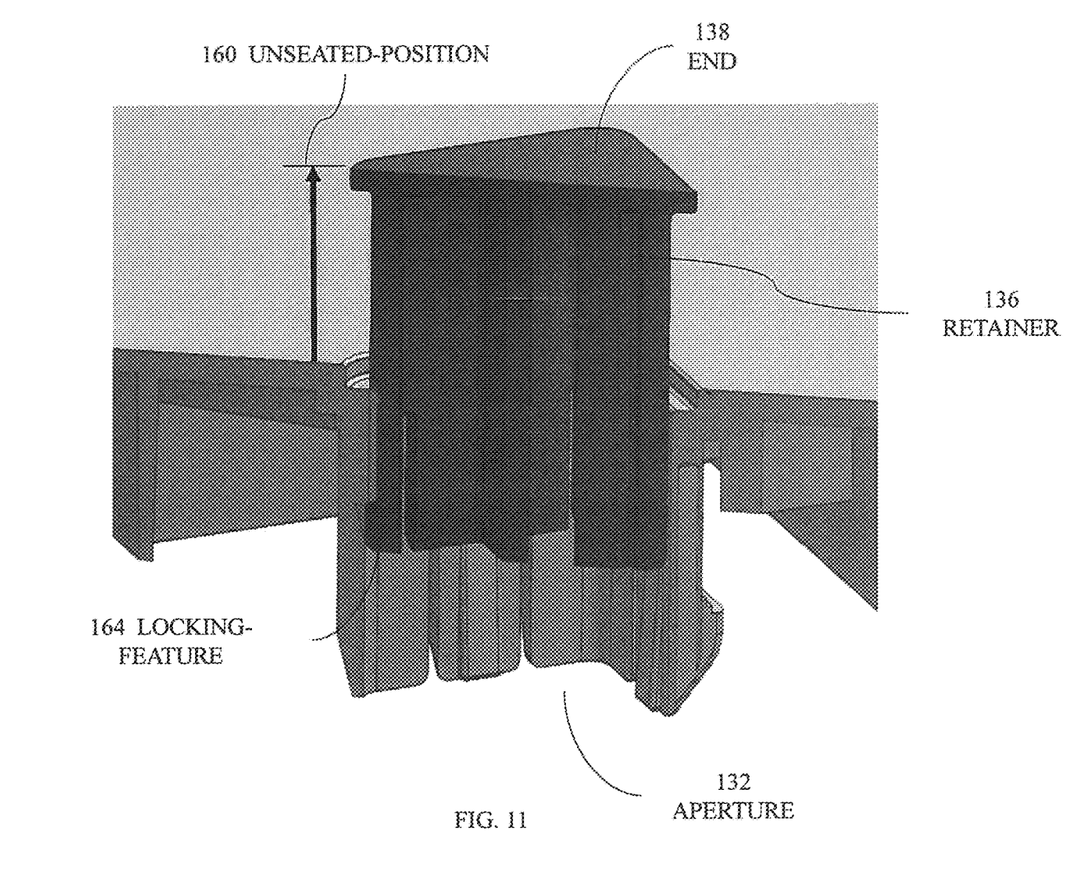
FIG. 11 is a cross-section view of the retainer of FIG. 6 with a locking-feature in accordance with one second embodiment.

The retainer 136 may also include a locking-feature 164 (see FIG. 11) that prevents the retainer 136 from being removed from the aperture 132 when the retainer 136 is in the unseated-position 160. The locking-feature 164 is beneficial during handling of the mounting-bracket 110, such as when being installed by the assembler and may prevent a loss of the retainer 136.

Figure 12:
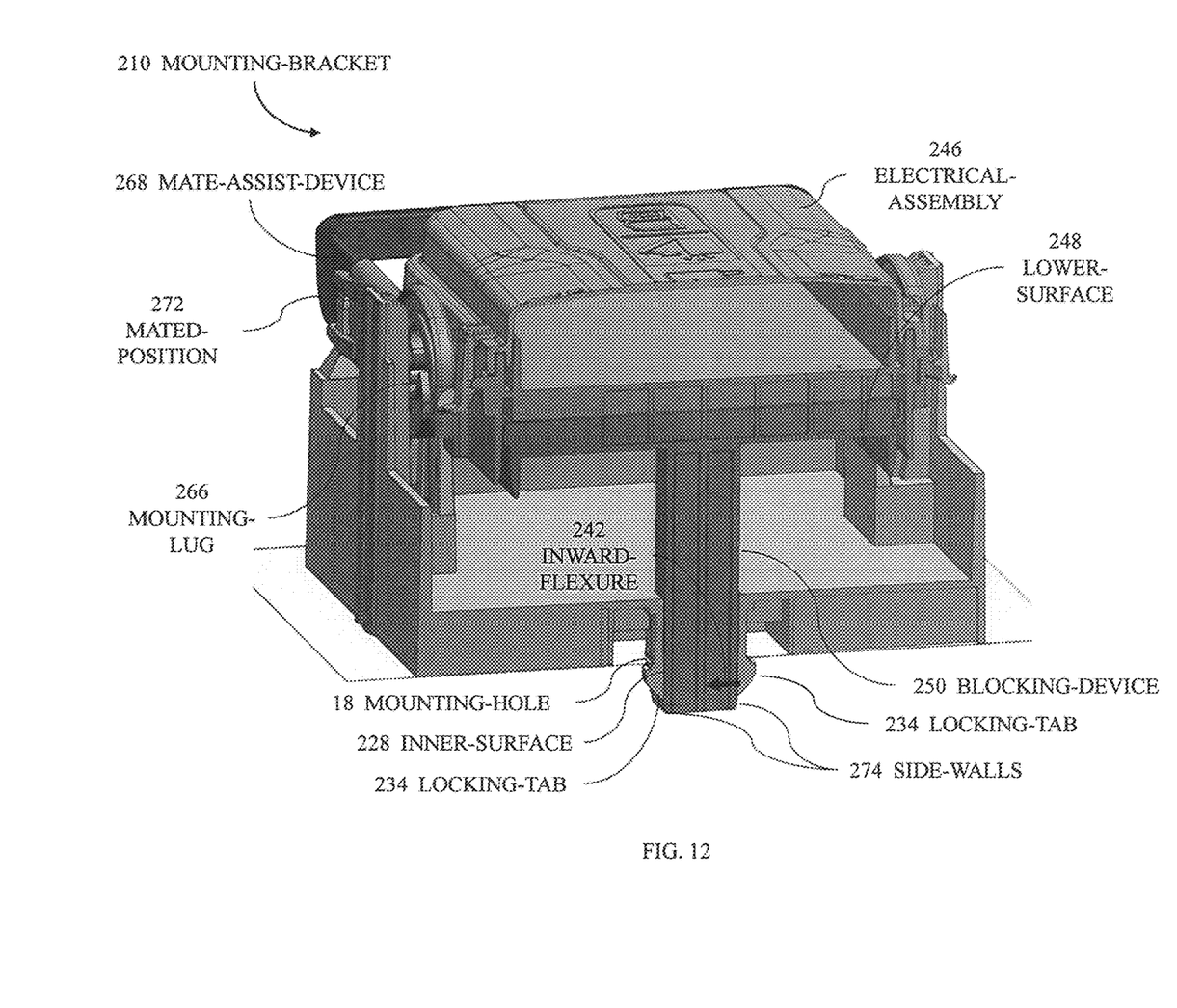
FIG. 12 is a cross-section view of a mounting-bracket in accordance with a third embodiment.

A non-limiting example of a third embodiment is illustrated in FIG. 12 in which a mounting-bracket 210 includes an electrical-assembly 246 including a mate-assist-device 268 movable from an unmated-position 270 to a mated-position 272. The mate-assist-device 268 is configured to engage and rotate on mounting-lugs 266. A lower-surface 248 of the electrical-assembly 246 includes a blocking-device 250 having side-walls 274 generally perpendicular to the lower-surface 248 extending below the lower-surface 248, wherein the blocking-device 250 is received within an aperture 232 of a retention-device 226 such that the side-walls 274 are in direct contact with an inner-surface 228 and prevent an inward-flexure 242 of a locking-tab 234 when the mate-assist-device 268 is moved from the unmated-position 270 to the mated-position 272, thereby preventing a removal of the mounting-bracket 210 from a mounting-hole 18.

The retention-device 226 may also include a ramp 252 that is located on the inner-surface 228. The ramp 252 defines a rise 254 and a run 256, wherein the rise 254 is located opposite a tip 258 of the locking-tabs 234, and wherein the run 256 extends along a portion of the inner-surface 228 opposite the locking-tab 234 to a point above a first-surface 214 of the mounting-hole 218. The ramp 252 may prevent an insertion of the blocking-device 250 until the mate-assist-device 268 is moved from the unmated-position 270 to the mated-position 272.

Figure 13:
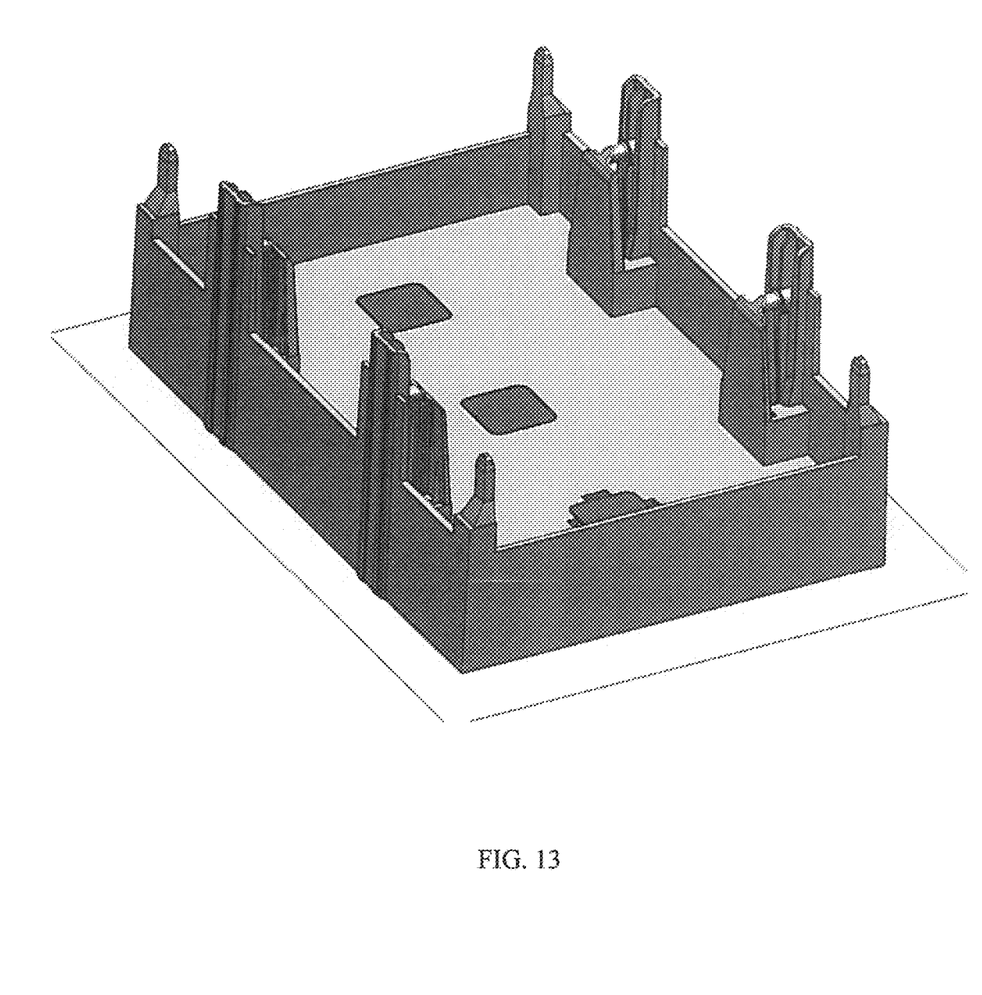
FIG. 13 is a base of a mounting-bracket in accordance with any of the embodiments.

The embodiments described herein are illustrated with a single retention-device 26 for illustration purposes only. Alternative embodiments may be envisioned in which multiple retention-devices 26 (see FIG. 13) are included in the mounting-bracket 10 to satisfy the application requirements.

Accordingly, a mounting-bracket 10 configured to attach to a mounting-surface 12 is provided. The mounting-bracket 10 solves the problem of added assembly tools, such as pneumatic screw drivers, or additional assembler installation procedures required at a lower cost than the prior art mounting brackets.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

We claim:

1. A mounting-bracket configured to attach to a mounting-surface, said mounting-surface having a first-surface and a second-surface opposite the first-surface, said mounting-surface defining a mounting-hole that connects the first-surface to the second-surface, comprising:
   a base and sides defining a cavity, said base including a retention-device that extends through the mounting-hole beyond the second-surface, said retention-device having an inner-surface and an outer-surface, said inner-surface defining an aperture, said outer-surface including locking-tabs that are in direct contact with the second-surface;
   a retainer received within the aperture of the retention-device, said retainer having an end and walls generally perpendicular to the end, wherein the walls are in direct contact with the inner-surface and prevent an inward-flexure of the locking-tabs;
   an electrical-assembly having a lower-surface that is received within the cavity; and
   a blocking-device in direct contact with the lower-surface of the electrical-assembly and the end of the retainer, thereby preventing a removal of the retainer from the aperture when the electrical-assembly is received within the cavity.

2. The mounting-bracket in accordance with claim 1, wherein the lower-surface of the electrical-assembly includes the blocking-device extending below the lower-surface, wherein the blocking-device is in direct contact with the end of the retainer, thereby preventing the removal of the retainer from the aperture when the electrical-assembly is received within the cavity.

3. The mounting-bracket in accordance with claim 1, wherein the electrical-assembly is removably locked to the sides when received within the cavity.

4. The mounting-bracket in accordance with claim 1, wherein the retention-device includes a ramp located on the inner-surface, said ramp defining a rise and a run, wherein the rise is located opposite a tip of the locking-tabs, and wherein the run extends along a portion of the inner-surface opposite the locking-tabs to a point above the first-surface of the mounting-hole, said ramp preventing an insertion of the retainer until a force is applied to seat the retainer.

5. The mounting-bracket in accordance with claim 4, wherein the retainer includes a locking-feature that prevents the retainer from being removed from the aperture when the retainer is in an unseated-position.

6. A mounting-bracket configured to attach to a mounting-surface, said mounting-surface having a first-surface and a second-surface opposite the first-surface, said mounting-surface defining a mounting-hole that connects the first-surface to the second-surface, comprising:
  a base and sides defining a cavity, said sides including mounting-lugs, said base including a retention-device that extends through the mounting-hole beyond the second-surface, said retention-device having an inner-surface and an outer-surface, said inner-surface defining an aperture, said outer-surface including locking-tabs that are in direct contact with the second-surface;
  a retainer received within the aperture of the retention-device, said retainer having an end and walls generally perpendicular to the end, wherein when the retainer is in a seated-position the walls are in direct contact with the inner-surface and prevent an inward-flexure of the locking-tabs; and
  an electrical-assembly having a lower-surface that is received within the cavity, said electrical-assembly including a mate-assist-device movable from an unmated-position to a mated-position, said mate-assist-device configured to engage and rotate on the mounting-lugs, said the lower-surface including a blocking-device extending below the lower-surface, wherein the retainer is moved to the seated-position by the blocking-device and the blocking-device is in direct contact with the end of the retainer when the mate-assist-device is moved from the unmated-position to the mated-position, thereby preventing a removal of the retainer from the aperture.

7. The mounting-bracket in accordance with claim 6, wherein the retention-device includes a ramp located on the inner-surface, said ramp defining a rise and a run, wherein the rise is located opposite a tip of the locking-tabs, and wherein the run extends along a portion of the inner-surface opposite the locking-tabs to a point above the first-surface of the mounting-hole, said ramp preventing an insertion of the retainer until the mate-assist-device is moved from the unmated-position to the mated-position.

8. The mounting-bracket in accordance with claim 7, wherein the retainer includes a locking-feature that prevents the retainer from being removed from the aperture when the retainer is in an unseated-position.

9. A mounting-bracket configured to attach to a mounting-surface, said mounting-surface having a first-surface and a second-surface opposite the first-surface, said mounting-surface defining a mounting-hole that connects the first-surface to the second-surface, comprising:
  a base and sides defining a cavity, said sides including mounting-lugs, said base including a retention-device that extends through the mounting-hole beyond the second-surface, said retention-device having an inner-surface and an outer-surface, said inner-surface defining an aperture, said outer-surface including locking-tabs that are in direct contact with the second-surface; and
  an electrical-assembly having a lower-surface that is received within the cavity, said electrical-assembly including a mate-assist-device movable from an unmated-position to a mated-position, said mate-assist-device configured to engage and rotate on the mounting-lugs, said lower-surface including a blocking-device having side-walls generally perpendicular to the lower-surface extending below the lower-surface, wherein the blocking-device is received within the aperture of the retention-device such that the side-walls are in direct contact with the inner-surface and prevent an inward-flexure of the locking-tabs when the mate-assist-device is moved from the unmated-position to the mated-position, thereby preventing a removal of the mounting-bracket from the mounting-hole.

10. The mounting-bracket in accordance with claim 9, wherein the retention-device includes a ramp located on the inner-surface, said ramp defining a rise and a run, wherein the rise is located opposite a tip of the locking-tabs, and wherein the run extends along a portion of the inner-surface opposite the locking-tabs to a point above the first-surface of the mounting-hole, said ramp preventing an insertion of the blocking-device until the mate-assist-device is moved from the unmated-position to the mated-position.

\* \* \* \* \*